(12) United States Patent
Hammadou et al.

(10) Patent No.: US 6,989,589 B2
(45) Date of Patent: Jan. 24, 2006

(54) PROGRAMMABLE SENSOR ARRAY

(75) Inventors: Tarik Hammadou, Surry Hills (AU); Philip Ogunbona, Figtree Wollongong (AU)

(73) Assignee: Motorola, Inc., Schaumburg, IL (US)

( * ) Notice: Subject to any disclaimer, the term of this patent is extended or adjusted under 35 U.S.C. 154(b) by 112 days.

(21) Appl. No.: 10/623,676

(22) Filed: Jul. 21, 2003

(65) Prior Publication Data

US 2005/0017315 A1   Jan. 27, 2005

(51) Int. Cl.
*H01L 23/02* (2006.01)
*H01L 29/80* (2006.01)

(52) U.S. Cl. ............... 257/685; 257/258; 257/290; 257/291; 257/443; 257/686; 438/109; 438/113

(58) Field of Classification Search ............ 257/72, 257/258, 290–293, 443–448, 685–696; 438/109, 438/113, 460, 462, 64, 66, 67, 74
See application file for complete search history.

(56) References Cited

U.S. PATENT DOCUMENTS

| | | | |
|---|---|---|---|
| 5,837,994 A * | 11/1998 | Stam et al. | 250/208.1 |
| 6,355,501 B1 | 3/2002 | Fung et al. | |
| 6,462,365 B1 * | 10/2002 | He et al. | 257/292 |
| 2002/0096753 A1 * | 7/2002 | Tu et al. | 257/680 |
| 2003/0042587 A1 * | 3/2003 | Lee | 257/678 |

* cited by examiner

Primary Examiner—Donghee Kang

(57) ABSTRACT

A programmable sensor array (1) having a plurality of programmable cells (2). Each of the cells (2) comprises a programmable module (4) and a sensor element(6) operatively coupled to the programmable module. There is also an analogue module (8), typically an analogue to digital converter, that provides the operatively coupling of the sensor element (6) to the programmable module (4). The sensor element (6), programmable module (4) and analogue module (8) are in a stacked relationship.

20 Claims, 4 Drawing Sheets

PROGRAMMABLE SENSOR ARRAY

FIELD OF THE INVENTION

This invention relates to a programmable sensor arrays. The invention is particularly useful for, but not necessarily limited to, programmable image sensor arrays formed in a stacked single package.

BACKGROUND OF THE INVENTION

Sensor arrays are typically used in a many applications, including medical analysis, security; production line monitoring, air analysis and satellite imaging. Also, sensor arrays in the form of image sensor arrays are often found in digital cameras and computer scanners. Sensor arrays have been commonly implemented using Application Specific Integrated Circuits (ASIC) technology. The benefits of using ASICs are well known and include Low-cost for small quantities, simplified product assembly and design security However, there are several disadvantages for ASICs such as slow fabrication and design time and high tooling costs.

Field programmable gate arrays (FPGAs) have become a widely used for both cost and time efficient electronic circuit development. A FGPA has a large number of digital configurable logical blocks (CLBs) allowing many logical functions to be realized. Data transfer rates between the FPGAs and external electronic memory can be as high as 100 Mbits/s and configuration times of tens of milliseconds are typically required for medium size FPGAs. This large reprogramming overhead compared with system clock periods of a few nanoseconds clearly limits the practical exploitation of a FPGA's dynamic capability.

Further to the above, it is known to couple a sensor array package to a FGPA package to provide a sensor array system. However, design and verification costs for this type of system may be unreasonably high and this may lead to undesirable delays affecting the time-to-market of a product. Also, having separate packages increases circuit board real estate overheads that is contrary to today's trend of device miniaturization. It would therefore be advantageous to provide a semiconductor package integrating a sensor array with a FGPA.

In this specification, including the claims, the terms 'comprises', 'comprising' or similar terms are intended to mean a non-exclusive inclusion, such that a method or apparatus that comprises a list of elements does not include those elements solely, but may well include other elements not listed

SUMMARY OF THE INVENTION

According to one aspect of the invention there is provided a programmable sensor array having a plurality of programmable cells, each of the cells comprising a programmable module and a sensor element. The sensor element is operatively coupled to the programmable module. The programmable module is programmable to perform logic functions and in use the sensor element provides a signal to the programmable module, the signal being dependent upon variations in an ambient condition monitored by the sensor element.

There is preferably an analogue module operatively coupling the programmable module to the sensor element.

Suitably, the sensor element is an image sensor element. More specifically, the image sensor element is pixel element. Alternatively, the sensor element may be a humidity sensor element or a gas sensor element or sonic sensor element or a bio-sensor element or any other ambient sensing element.

Suitably, the sensor element and programmable module are in a stacked relationship. Preferably, the sensor element, programmable module and analogue module are in a stacked relationship. Suitably, the analogue module is sandwiched between the sensor element and programmable module.

The sensor element may be formed on an upper semiconductor substrate. The programmable module may be formed on a lower semiconductor substrate. The analogue module may be formed on an intermediate semiconductor substrate sandwiched between the upper semiconductor substrate and lower semiconductor substrate.

Preferably, the programmable module comprises configurable logic blocks. Suitably, the programmable module forms part a field programmable logic array.

Suitably, in plan view the sensor element is directly aligned with at least part of the programmable module. Preferably, in plan view the sensor element is in direct alignment with the programmable module.

Suitably, the sensor element is directly aligned with at least part of the analogue module. Preferably, in plan view the sensor element is in direct alignment with the analogue module.

Preferably, the cells are operatively coupled to input-output ports thereby allowing communication of the sensor array with external electronic circuitry.

The analogue module may be an analogue to digital converter. The analogue module may include a differential amplifier or a comparator.

According to another aspect of the invention there is provided a programmable sensor array package having a plurality of programmable cells, each of the cells comprising a programmable module formed on a lower semiconductor substrate. There is a sensor element operatively coupled to the programmable module, the sensor element being formed on an upper a semiconductor substrate and the sensor element and programmable module being in a stacked relationship.

There is preferably an analogue module operatively coupling the programmable module to the sensor element. Suitably, the analogue module is sandwiched between the sensor element and programmable module. The analogue module may be formed on an intermediate semiconductor substrate sandwiched between the upper semiconductor substrate and lower semiconductor substrate.

BRIEF DESCRIPTION OF THE DRAWINGS

In order that the invention may be readily understood and put into practical effect, reference will now be made to a preferred embodiment as illustrated with reference to the accompanying drawings in which.

DETAILED DESCRIPTION OF THE PREFERRED EMBODIMENT OF THE INVENTION

Figure 1:
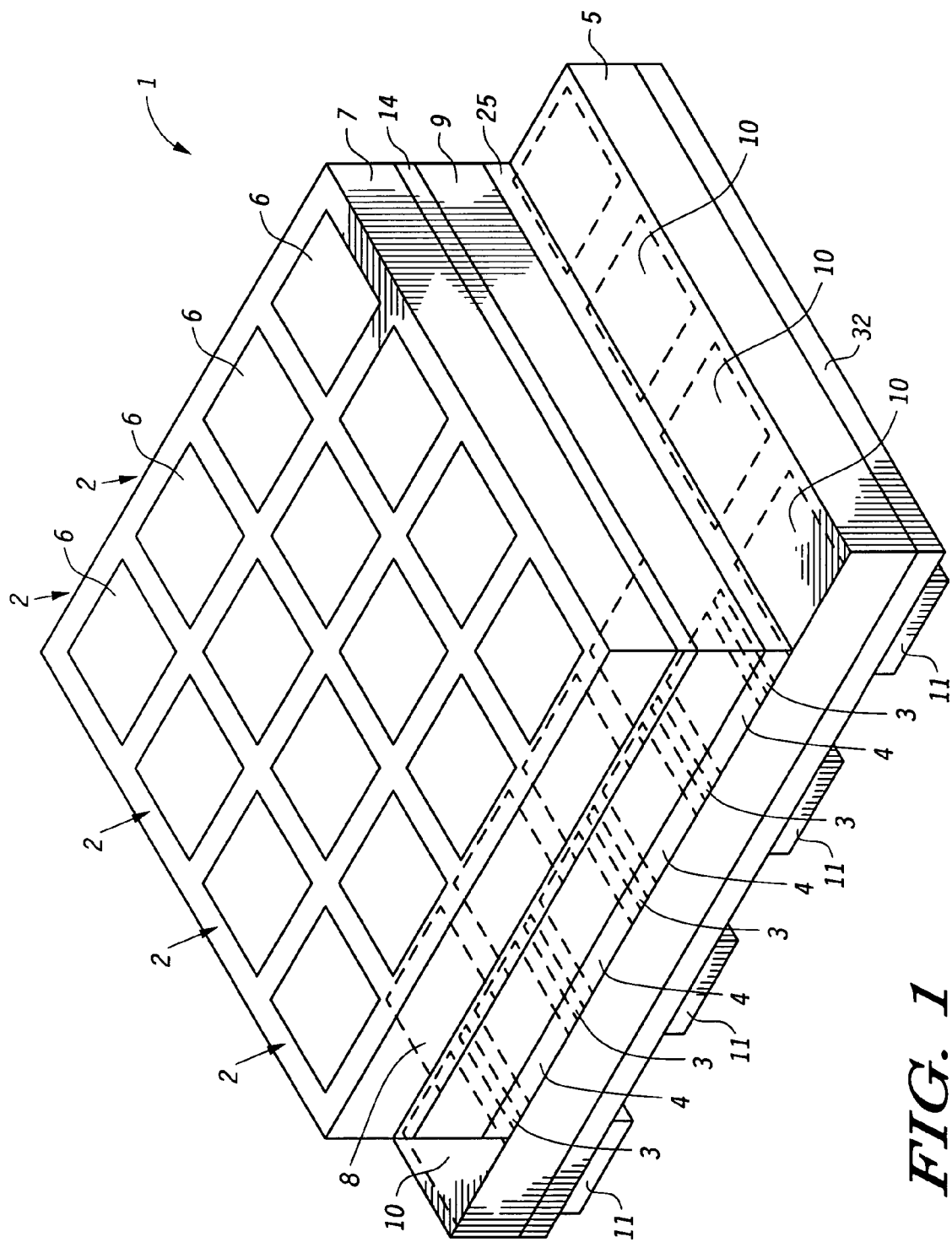
FIG. 1 is a schematic view of a programmable sensor array that has plurality of programmable cells in accordance with the present invention.

In the drawings, like numerals on different Figs are used to indicate like elements throughout. In FIG. 1 there is illustrated a schematic view of a programmable sensor array 1 that has plurality of programmable cells 2. Each of the cells 2 of the programmable sensor array 1 comprises a programmable module 4 formed on a lower semiconductor substrate 5. A sensor element 6 is formed on an upper semiconductor substrate 7 and is operatively coupled to the programmable module 4 through an analogue module 8 formed on an intermediate semiconductor substrate 9 sandwiched between the upper semiconductor substrate 7 and lower semiconductor substrate 5. Accordingly, the sensor element 5, programmable module 4 and analogue module 6 are in a stacked relationship in which the analogue module 6 is sandwiched between the sensor element 6 and programmable module 4.

Formed on the lower semiconductor substrate 5 are input-output ports 10 operatively and respectively coupled to a programmable module 4. Also on the lower semiconductor substrate 5 are surface mountable pads 11 for surface mounting of the programmable sensor array 1 to a pads of a Printed Circuit Board (PCB), thereby allowing communication of the sensor array 1 with external electronic circuitry.

The sensor element 6 is typically a photodiode pixel element of an image sensor. In alternative forms, as will be apparent to a person skilled in the art, the sensor element 6 may be any sensor such as a gas sensor element or sonic sensor element or a bio-sensor element or any other sensing element. However, in the remainder of this specification the sensor element 6 will be presumed to be an image sensor element and therefore the programmable array will be presumed to be a programmable image sensor array.

Figure 2:
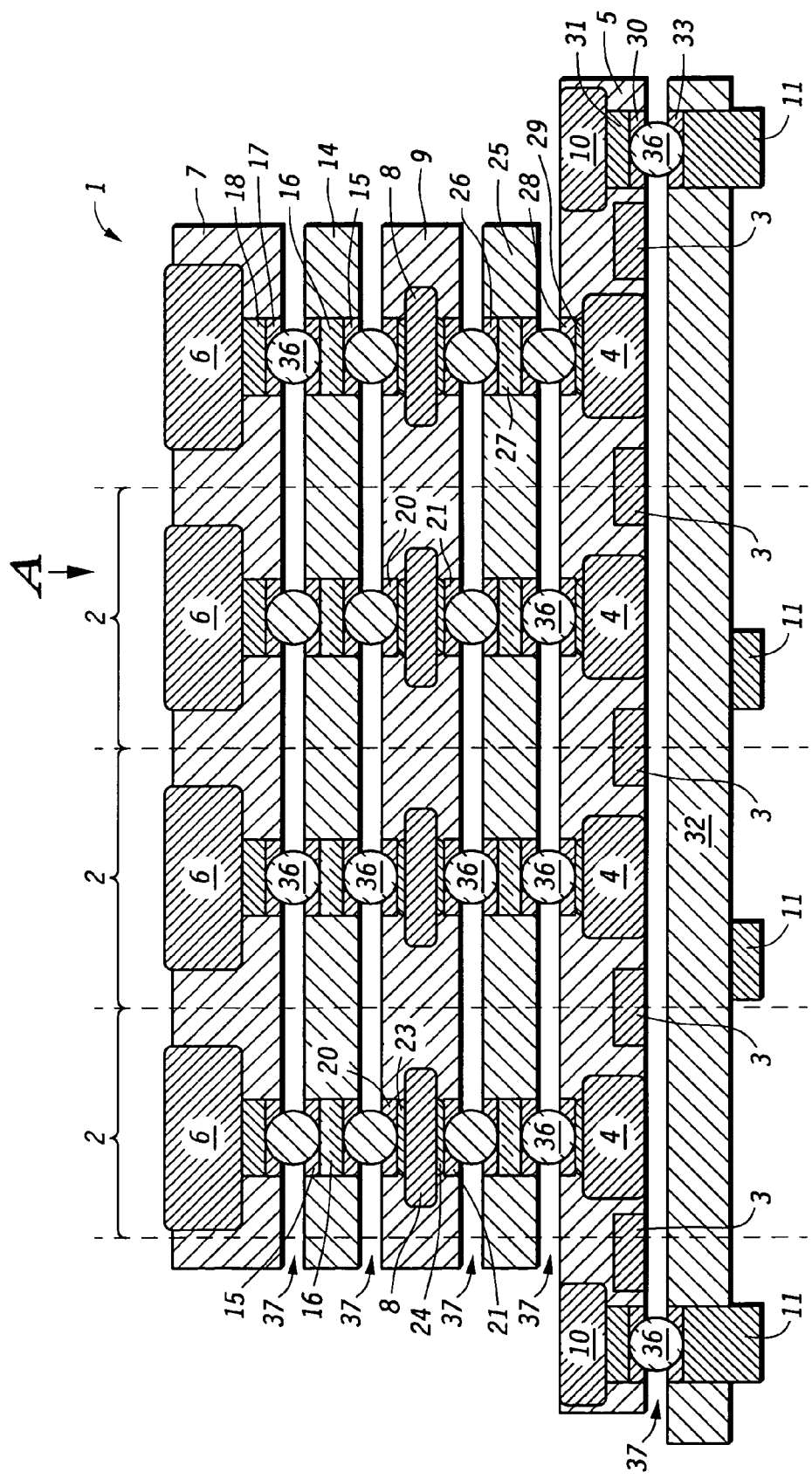
FIG. 2 is a detailed schematic cross sectional view of the programmable sensor array of FIG. 1 before solder re-flow.

Referring to FIG. 2, there is illustrated a detailed schematic cross sectional view of the programmable sensor array 1 before solder re-flow. As illustrated, there is shown stacking and interconnecting of the sensor element 5, programmable module 4 and analogue module 6. Between upper semiconductor substrate 7 and intermediate semiconductor substrate 9 is a dielectric substrate layer 14. The dielectric substrate layer 14 has vias or apertures 15 with an electrically conductive deposit 16 disposed therein. Also an inner surface of the vias 15 is coated with an electrically conductive film. The upper semiconductor substrate 7 also has vias or apertures 17 with an inner surface coated with an electrically conductive film. Furthermore, there is an electrically conductive deposit 18 disposed in apertures 17, the electrically conductive deposit 18 being coupled to an output electrode of a respective sensor element 5

The intermediate semiconductor substrate 9 has vias 20,21 with inner conductive surfaces and electrically conductive deposits 23,24 coupled to respective input electrodes and output electrodes of respective analogue modules 6. Between the lower semiconductor substrate 5 and intermediate semiconductor substrate 9 is a dielectric substrate layer 25 with vias or apertures 26 having an electrically conductive deposit 27 disposed therein. Also the inner surface of the vias 26 is coated with an electrically conductive film. The lower semiconductor substrate 5 has vias or apertures 28 with an inner surface coated with an electrically conductive film and an electrically conductive deposit 29 is disposed therein that is coupled to an input electrode of a respective programmable module 4. Further, the lower substrate 5 has the input-output ports 10 deposited thereon. The input-output ports 10 are coupled to an electrical conductive deposit 31 in respective vias 30 on the lower substrate 5. The vias 30 have an inner surface coated with an electrically conductive film and each programmable module 4 is coupled to respective input-output port 10, throughrouting switches 3 formed on semiconductor substrate 5 (connections not shown) as will be apparent to a person skilled in the art.

Underneath the lower semiconductor substrate 5 is insulating mount 32 with vias 33 having conductive inner surfaces and a conductive deposit extending out of each of the vias 33 to provide the surface mountable pad 11.

Figure 3:
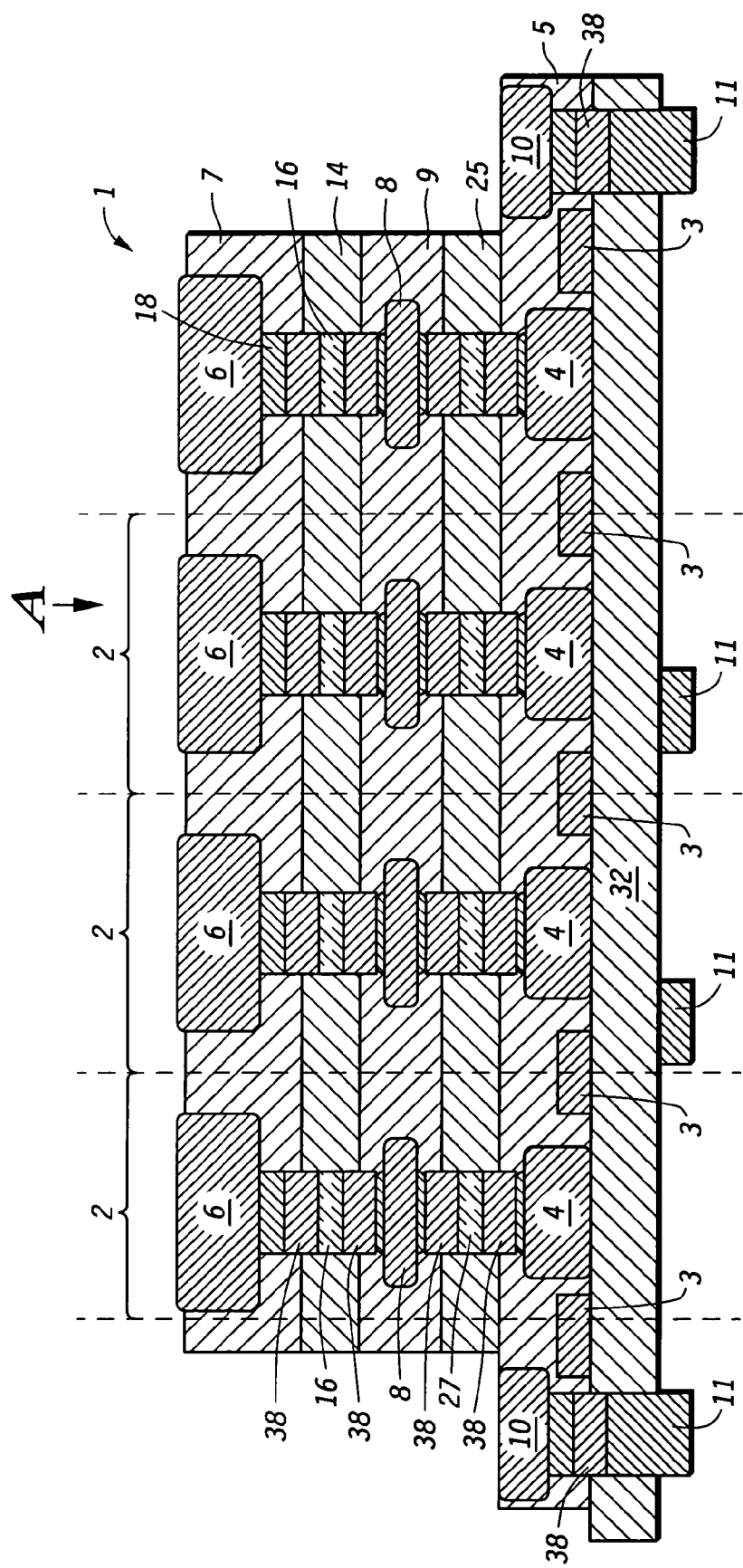
FIG. 3 is a detailed schematic cross sectional view of the programmable sensor array of FIG. 1 after solder re-flow.

Disposed in aligned via pairs: 15,17; 15,20; 21,26; 26,28; 30,33 are solder balls 36. During the manufacturing process for the programmable sensor array 1, the array 1 is typically heated, in a reflow oven, in order to melt the solder balls 36. After the solder balls 36 melt and then solidify spaces 37 have been closed and the programmable sensor array 1 after solder re-flow is illustrated in FIG. 3 in which the solder balls 36 have become solder connections 38. Thus, as illustrated, the solder connections 38 and conductive deposits 18, 23, 24 and 29 provide an electrically conductive paths such that the analogue module 8 operatively couples the programmable module 4 to the sensor element 6. The programmable sensor array 1 is then packaged using any of the well-known packaging techniques to form a programmable sensor array as will be apparent to a person skilled in the art.

In plan view, as indicated by arrow A, the sensor element 6 is directly is in direct alignment with the programmable module 4 in a respective programmable cell 2. Also in plan view, the sensor element 6 is in direct alignment with the analogue module 8 in a respective programmable cell 2. This direct alignment of a sensor element 6, programmable module 4 and analogue module 8 provides for real estate overheads therefore complementing today's trend of device miniaturization.

Figure 4:
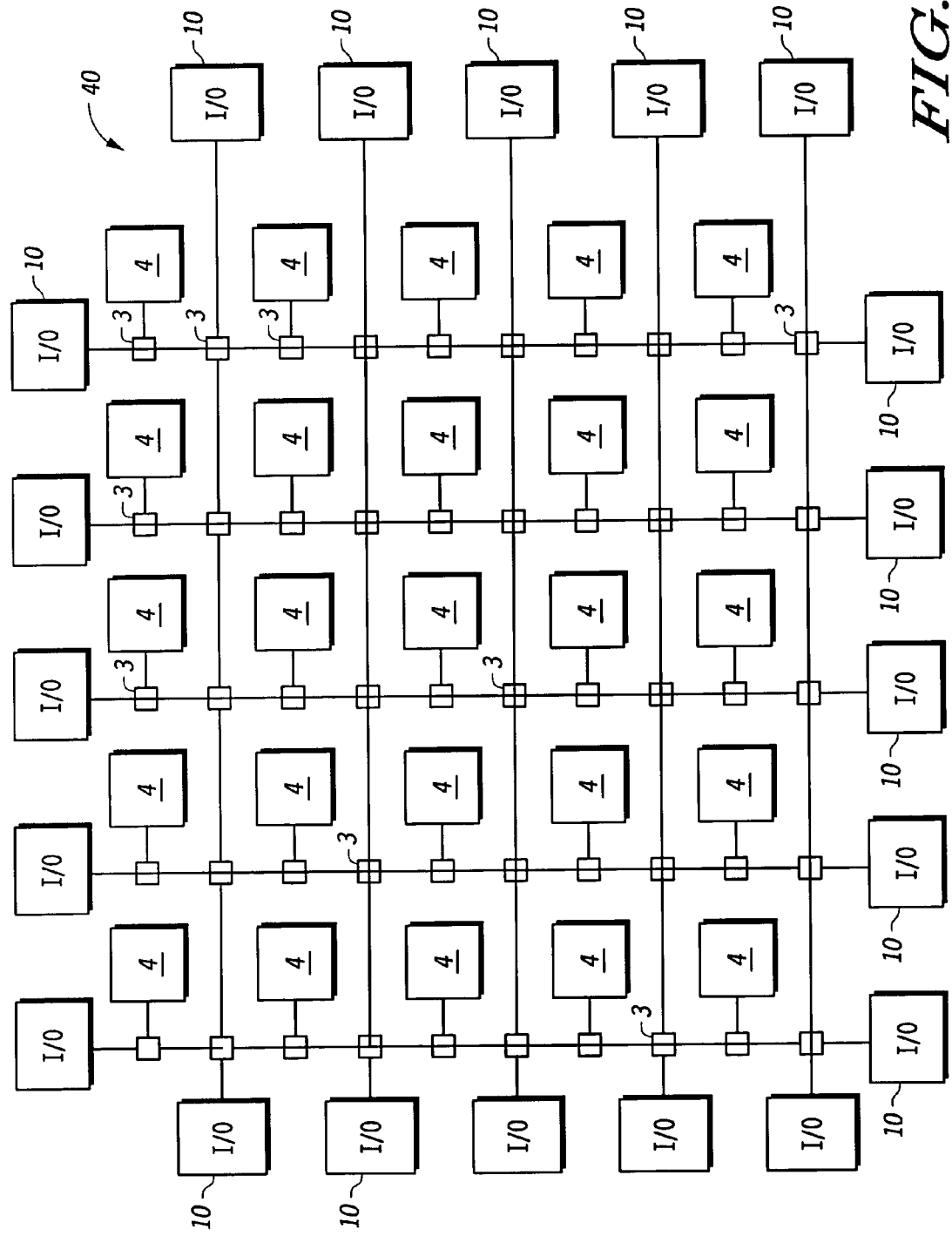
FIG. 4 is a block diagram illustrating a field programmable logic array forming part of the programmable sensor array of FIG. 1.

Each programmable module 4 comprises configurable logic blocks typically forming part of a field programmable logic array 40 as illustrated in FIG. 4. The logic array 40 is configuarable by programming each programmable module 4 with the assistance of routing switches 3 via the input-output ports 10. Thus as shown, the input-output ports 10 are selectively and operatively coupled to a programmable module 4 Advantageously, the programmable module 4 is programmable to perform logic functions and in use the sensor element 6 provides a signal Si to the programmable module 4. This signal Si is processed into a digital format, by the analogue module 8, and is dependent upon variations in an ambient condition monitored by the sensor element 6. Further, although the analogue module 8 is typically an analogue to digital converter, the analogue module 8 may include or be essentially a differential amplifier or a comparator. As will be apparent to a person skilled in the art, the programmable sensor array 1 can be implemented primarily with Metal Oxide Semiconductor (MOS) or Complementary Metal Oxide Semiconductor or any other suitable semiconductor technology. Also, when considering the invention's use in imaging, the programmable sensor array 1 can programmed to function as a single image sensor for a variety of applications such as digital camera image capture, surveillance applications and other imaging uses.

The detailed description provides a preferred exemplary embodiment only, and is not intended to limit the scope, applicability, or configuration of the invention. Rather, the detailed description of the preferred exemplary embodiment provides those skilled in the art with an enabling description for implementing preferred exemplary embodiment of the invention. It should be understood that various changes may be made in the function and arrangement of elements without departing from the spirit and scope of the invention as set forth in the appended claims.

We claim:

1. A programmable sensor array having a plurality of programmable cells, each of the cells comprising:
    a programmable module of configurable logic blocks; and
    a sensor element operatively coupled to the programmable module, wherein in plan view the sensor element is directly aligned with at least part of the programmable module, and wherein the programmable module is programmable to perform logic functions and in use the sensor element provides a signal to the programmable module, the signal being dependent upon variations in an ambient condition monitored by the sensor element.

2. A programmable sensor array, as claimed in claim 1, further including an analogue module operatively coupling the programmable module to the sensor element.

3. A programmable sensor array, as claimed in claim 2, wherein the sensor element is an image sensor element.

4. A programmable sensor array, as claimed in claim 3, wherein the image sensor element is pixel element.

5. A programmable sensor array, as claimed in claim 2, wherein the sensor element, programmable module and analogue module are in a stacked relationship.

6. A programmable sensor array, as claimed in claim 2, wherein the analogue module is sandwiched between the sensor element and programmable module.

7. A programmable sensor array, as claimed in claim 2, wherein the sensor element is formed on an upper semiconductor substrate.

8. A programmable sensor array, as claimed in claim 7, wherein the programmable module is formed on a lower semiconductor substrate.

9. A programmable sensor array, as claimed in claim 8, wherein the analogue module is formed on an intermediate semiconductor substrate sandwiched between the upper semiconductor substrate and lower semiconductor substrate.

10. A programmable sensor array, a claimed in claim 2, wherein the cells are operatively coupled to input-output ports thereby allowing communication of the sensor array with external electronic circuitry.

11. A programmable sensor array, as claimed in claim 2, wherein the analogue module is an analogue to digital converter.

12. A programmable sensor array, a claimed in claim 2, wherein the analogue module includes a differential amplifier or a comparator.

13. A programmable sensor array, as claimed in claim 2, wherein the analogue module includes a comparator.

14. A programmable sensor array, as claimed in claim 1, wherein the programmable module forms part a field programmable logic array.

15. A programmable sensor array, as claimed in claim 1, wherein in plan view the sensor element is in direct alignment with the programmable module.

16. A programmable sensor array, as claimed in claim 15, wherein the sensor element is directly aligned with at least part of the analogue module.

17. A programmable sensor array, a claimed in claim 16, wherein in plan view the sensor element is in direct alignment with the analogue module.

18. A programmable sensor array package having a plurality of programmable cells, each of the cells comprising:
    a programmable module of configurable logic blocks formed on a lower semiconductor substrate; and
    a sensor element operatively coupled to the programmable module, the sensor element being formed on an upper a semiconductor substrate and the sensor element and programmable module being in a stacked relationship, wherein in plan view the sensor element is directly aligned with at least part of the programmable module.

19. A programmable sensor array package, as claimed in claim 18, further including an analogue module operatively coupling the programmable module to the sensor element.

20. A programmable sensor array package, as claimed in claim 19, wherein the analogue module is formed on an intermediate semiconductor substrate sandwiched between the upper semiconductor substrate and lower semiconductor substrate.

* * * * *